United States Patent
Boffito et al.

(10) Patent No.: US 6,753,648 B2
(45) Date of Patent: Jun. 22, 2004

(54) CESIUM DISPENSERS AND PROCESS FOR THE USE THEREOF

(75) Inventors: Claudio Boffito, Rho (IT); Luca Toia, Carnago (IT); Lorena Cattaneo, Busto Arsizio (IT)

(73) Assignee: SAES Getters S.p.A., Lainate (IT)

( * ) Notice: Subject to any disclaimer, the term of this patent is extended or adjusted under 35 U.S.C. 154(b) by 0 days.

(21) Appl. No.: 10/465,004

(22) Filed: Jun. 19, 2003

(65) Prior Publication Data

US 2004/0001916 A1 Jan. 1, 2004

Related U.S. Application Data

(63) Continuation of application No. PCT/IT02/00301, filed on May 7, 2002.

(30) Foreign Application Priority Data

Jun. 13, 2001 (IT) ..................... MI2001A0995

(51) Int. Cl.[7] .............................................. H01J 17/26
(52) U.S. Cl. ................ 313/564; 313/550; 313/556; 313/566
(58) Field of Search ................ 313/550, 556, 313/564, 566, 637, 545

(56) References Cited

U.S. PATENT DOCUMENTS

| | | |
|---|---|---|
| 2,117,735 A | 5/1938 | Lester |
| 3,578,834 A | 5/1971 | Della Porta, et al. |
| 3,579,459 A | 5/1971 | Della Porta, et al. |
| 3,598,384 A | 8/1971 | Zucchinelli et al. |
| 3,636,302 A | 1/1972 | Della Porta, et al. |
| 3,663,121 A | 5/1972 | Della Porta, et al. |
| 4,146,497 A | 3/1979 | Barosi et al. |
| 4,233,936 A | 11/1980 | Longsderff et al. |
| 4,628,198 A | 12/1986 | Giorgi |
| 5,066,888 A | 11/1991 | Van Der Marel et al. |
| 6,013,384 A | 1/2000 | Kido et al. |

FOREIGN PATENT DOCUMENTS

| | | |
|---|---|---|
| EP | 0 130 803 A2 | 1/1985 |
| EP | 0 360 317 A1 | 3/1990 |
| EP | 0 845 924 A2 | 6/1998 |
| EP | 0 949 696 A2 | 10/1999 |
| JP | 06231727 A | 8/1994 |
| JP | 09-78058 A | 3/1997 |
| WO | WO 95/05191 A1 | 2/1995 |

*Primary Examiner*—Vip Patel
(74) *Attorney, Agent, or Firm*—Akin, Gump, Strauss, Hauer & Feld, L.L.P.

(57) ABSTRACT

Cesium dispensers are produced based on the use of a mixture of at least one reducing agent and at least one cesium compound selected among molybdate, tungstate, niobate, tantalate, silicate and zirconate. The cesium dispensers are useful in the production of OLED-type screens.

18 Claims, 3 Drawing Sheets

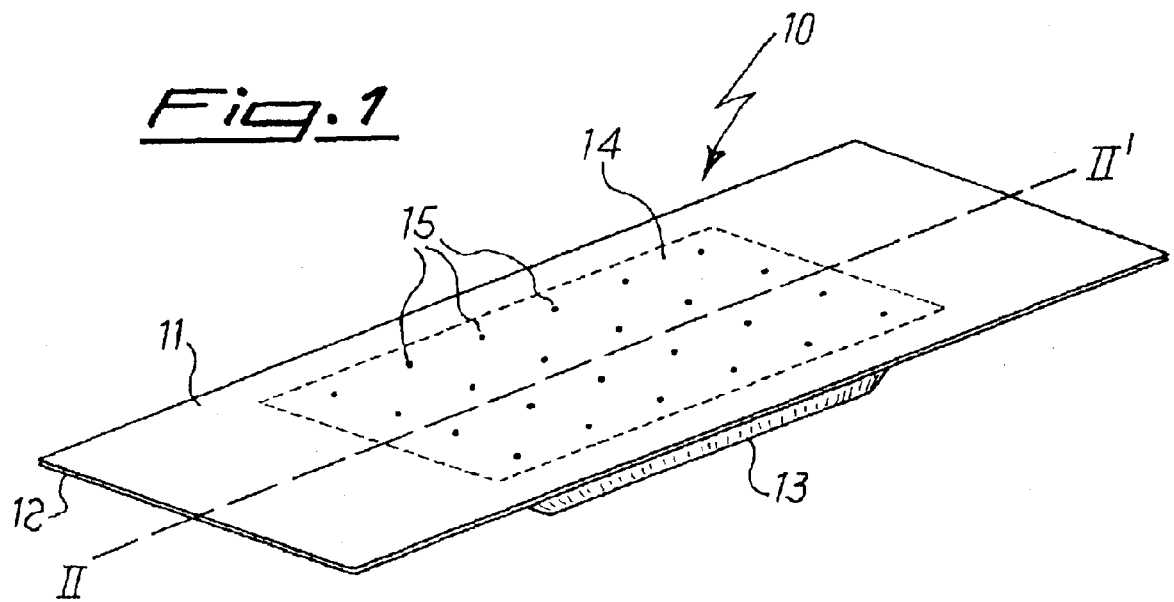
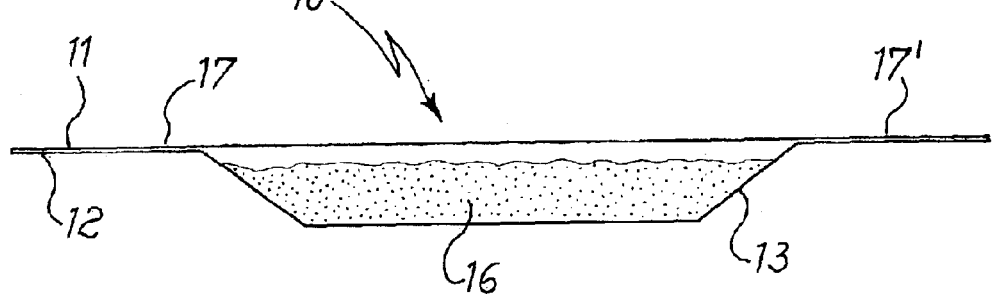

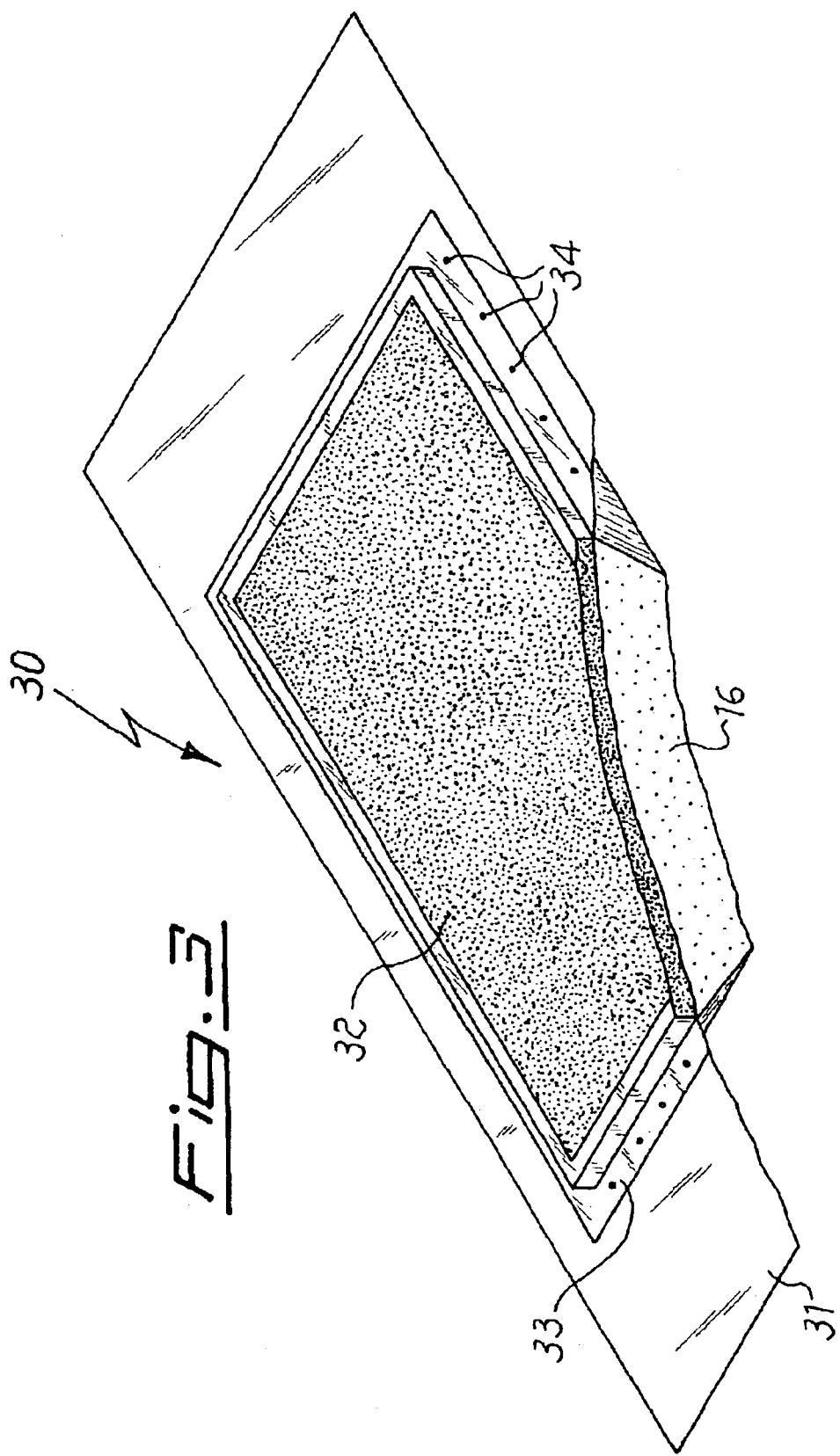

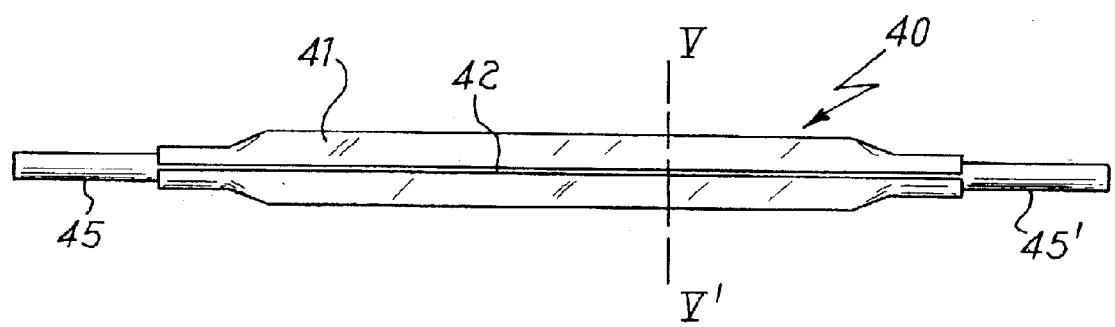
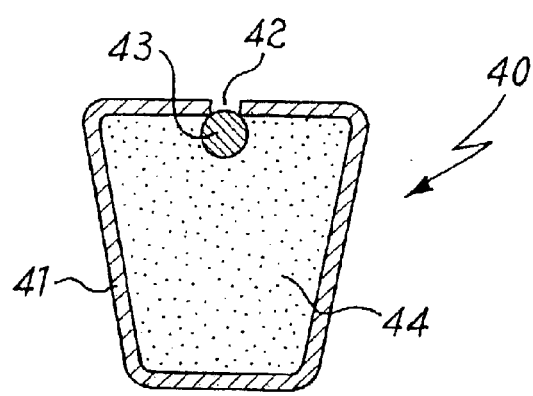

CESIUM DISPENSERS AND PROCESS FOR THE USE THEREOF

CROSS-REFERENCE TO RELATED APPLICATIONS

This application is a continuation of International Application No. PCT/IT02/00301, filed May 7, 2002, which was published in the English language on Nov. 21, 2002 under International Publication No. WO 02/093664, and the disclosure of which is incorporated herein by reference.

BACKGROUND OF THE INVENTION

The present invention relates to cesium dispensers and a process for using them.

Cesium has been used for a long time in the electronics field. In particular, this metal has been used in the past for the production of photosensible surfaces, for example of image intensifiers or photomultiplier tubes.

A novel application field for cesium is in the OLED (Organic Light Emitting Display) screens.

In short, an OLED is formed of a first transparent planar support (of glass or plastics); a second, not necessarily transparent support that may be realized in glass, metal or plastics, essentially planar and parallel to the first support and secured along the perimeter thereof, so as to form a closed space; and a structure in the space that is active in forming an image. The active structure is formed in turn by a first set of linear and reciprocally parallel, transparent electrodes, deposited on the first support; a multilayer of different electroluminescent organic materials comprising at least one layer of electron-conductive material and one layer of an electronic vacancies (also defined in the field as "holes") conductive material deposited on the first set of electrodes; a second set of linear and reciprocally parallel electrodes that are orthogonally oriented with respect to those of the first set and in contact with the opposite side of the multilayer of organic materials, so that the latter is comprised between the two sets of electrodes. For a more detailed description of the structure and operation of OLED screens one can refer for instance to European published patent applications EP-A-0 845 924 and EP-A-0 949 696, Japanese published patent application JP-A-9-078058, and U.S. Pat. No. 6,013,384. Recently it has been ascertained that the doping of one or more layers of the organic multilayer with small amounts of electron-donor metals, in particular cesium, enables reduction of the potential difference to be applied to the sets of electrodes for the functioning of screens, and thus reduction of the energy consumption of the latter.

Due to its high reactivity to atmospheric gases and moisture, cesium is not usually used in industry as pure metal, but rather in the form of its compounds which are stable to air at room temperature.

Some cesium compounds release the metal by simple heating. Among these compounds alloys with silicon or germanium may be cited, as described for example in European published patent application EP-A-0 360 317 and U.S. Pat. No. 5,066,888, as well as the intercalation compound of cesium with graphite, having the formula $CsC_8$, cited in European patent application EP-A-0 130 803. These compounds have, however, no practical application at industrial level.

Cesium dichromate, $Cs_2Cr_2O_7$, or more commonly cesium chromate, $Cs_2CrO_4$, is normally used in industry in mixture with a reducing agent. By heating these mixtures at temperatures generally over 500° C., and usually between 550 and 650° C., a reaction takes place wherein chromium is reduced to a lower valence, as a consequence of which cesium is released in vapor form. As reducing agents aluminum, silicon or getter alloys, i.e., alloys based on titanium or zirconium with aluminum or one or more transition elements, are generally used. The use of these mixtures is described for example in U.S. Pat. No. 2,117, 735.

These compounds are generally introduced into suitable dispensers that are able to retain solid particles of the compounds, but have at least a portion of the surface permeable to cesium vapors. Various forms of dispensers are the object, for instance, of U.S. Pat. Nos. 3,578,834; 3,579, 459; 3,598,384; 3,636,302; 3,663,121; and 4,233,936. A further property required for cesium dispensers is not to release gases that are detrimental to the operation of devices where cesium is used during their production.

Cesium chromate and dichromate suffer, however, the disadvantage of containing hexavalent chromium, which may cause irritations by contact, ingestion or respiration and may be carcinogenic in case of protracted exposures.

In production processes of common devices in which cesium is used (image intensifiers or photomultipliers) high temperatures are reached, and only by using chromate and dichromate can one avoid the release of cesium in an early stage of the process. In addition, limited productions are obtained in these cases, and consequently the amounts of chromate that are used are limited too.

The temperatures of production processes of OLEDs are lower in contrast. For these screens productions on a very large scale, on the order of tens of millions of pieces per year, are foreseen. With these production volumes, the safety problems linked with the transportation and use of chromates become significant. In the production of OLEDs it is thus possible and highly desirable not to resort to the use of $Cs_2CrO_4$ or $Cs_2Cr_2O_7$ to evaporate cesium.

BRIEF SUMMARY OF THE INVENTION

An object of the present invention is to provide cesium dispensers particularly suitable for the production of OLED screens, wherein cesium is not present in the form of a chromium salt.

A further object of this invention is to provide a process for the use of cesium dispensers in the production of OLED screens.

These objects are achieved by the present invention, wherein a first aspect relates to cesium dispensers formed by a container able to retain solid particles, but having at least a part of the surface permeable to cesium vapors and containing a mixture of at least one cesium compound and at least one reducing agent, characterized in that the cesium compound is selected among molybdate, tungstate, niobate, tantalate, silicate, and zirconate.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1 is a perspective view of a first possible cesium dispenser according to the invention;

FIG. 2 is a sectional view along line II–II' in FIG. 1 of the same dispenser;

FIG. 3 is a perspective, partially cut-away view of another possible dispenser of the invention;

FIG. 4 is a top plan view of a further possible dispenser of the invention; and

FIG. 5 is a sectional view along line V–V' of the dispenser in FIG. 4.

DETAILED DESCRIPTION OF THE INVENTION

The inventors have found that mixtures of one or more reducing agents and one or more compounds selected among cesium molybdate, $Cs_2MoO_4$, cesium tungstate, $Cs_2WO_4$, cesium niobate, $CsNbO_3$, cesium tantalate, $CsTaO_3$, cesium silicate, $Cs_2SiO_3$, and cesium zirconate, $Cs_2ZrO_3$, are compatible with the production process of OLEDs, in that they are able to vaporize cesium at lower temperatures than the corresponding chromates practically without releasing gases potentially harmful for OLEDs, mainly comprising water vapor. In particular, the vaporization temperatures of cesium from these mixtures are generally lower than 450° C. These temperatures can easily be reached locally on the cesium dispenser in the purification chambers of OLEDs.

The mixtures used in the dispensers of the invention may comprise more than one cesium compound and more than one reducing element or compound, but generally a single component of each kind is used. Accordingly, in the following, the singular "compound" or "agent" will be used, but will be understood to include the possibility of the plural.

As a reducing agent it is possible to use one of the already known components used in dispensers based on chromates, such as aluminum, silicon, zirconium or titanium, or alloys containing zirconium or titanium, for example the alloy having a percent composition by weight Zr 84%—Al 16%, produced and sold by SAES Getters S.p.A. under the trademark St 101®, or the alloy having a percent composition by weight Zr 76.5%—Fe 23.5%, produced and sold by SAES Getters S.p.A. under the trademark St 198®.

In order to promote contact between the cesium compound and the reducing agent, these are preferably used in the form of powders. Both components of the mixture generally have a particle size less than 1 mm, preferably less than 500 μm; even more preferably the particle size is comprised between about 10 and 125 μm. Powders with grains smaller than 10 μm are generally difficult to be treated in production and retained in the dispenser. Furthermore, in the case of the reducing agent, powders too fine may become pyrophoric, thus causing safety problems in the production plant. In contrast, with powders having sizes greater than those listed, the contact between the mixture components becomes worse, and the reaction causing the release of cesium slows down.

The weight ratio between the cesium compound and the reducing agent can vary between wide limits. The ratio is preferably comprised between 10:1 and 1:10. The use of a cesium compound in great excess with respect to the reducing agent does not offer practical advantages. On the contrary, mainly when the reducing agent is a getter alloy, such as the mentioned alloy St 101®, its excess in the mixture may become useful, since the portion not involved in the reaction with the cesium compound can carry out an absorbing action on the gases that may become free during the reaction.

The mixture can be used in the form of free powders, or it is possible to preform pellets of the same. The use of pellets bears the advantage of further improving the contact between the components of the mixture and facilitating the charging operations of the container.

The container can be realized in every material and shape compatible with the specific application.

In particular, with reference to the material, this must be chemically inert with respect to the working atmosphere and the cesium-releasing mixture in the whole temperature range foreseen for the use, generally between room temperature and about 450° C. In the same temperature range, the material forming the container must not undergo noticeable physical changes, such as to modify its mechanical resistance or shape, and must have the lowest possible values of gas emission. Materials having these properties are, for instance, metals or metallic alloys, ceramics, graphite, and boron nitride, BN. The use of metals is preferred due to their easier workability and formability. A further advantage in using metals, graphite and BN is that the dispenser can be heated up to the cesium vaporization temperature by simple passing of current through the container walls. Preferred metals and alloys for manufacturing the container are molybdenum, tantalum, tungsten, nickel, steel, and nickel-chromium alloys.

The shape of the container may be any of those known from the previously mentioned U.S. Pat. Nos. 3,578,834; 3,579,459; 3,598,384; 3,636,302; 3,663,121; and 4,233,936. Containers of various shapes and materials are also commercially available, for example, from the Austrian company Plansee or from the USA company Midwest Tungsten Service.

In FIGS. 1 and 2 is represented, in perspective and sectional views respectively, a possible dispenser using the mixtures of the invention. In particular, FIG. 2 is the sectional view of the dispenser along line II-II' of FIG. 1. Dispenser 10 is formed of two metal foils 11 and 12. A depression 13, obtained for instance by cold forming the foil is arranged in the central part of foil 12. Foil 11 has, in its central zone 14 (bordered by the broken line in FIG. 1), a set of small through holes 15. In the assembled dispenser, zone 14 corresponds to depression 13, which contains a mixture 16 of at least one cesium compound and at least one reducing agent according to the 25 invention. Foils 11 and 12 can be secured to each other, outside depression 13, in any way assuring powders tightness. For example, a mechanical fixing can be obtained in the form of "tongues" in a foil folded on the other, or a fixing by continuous or spot welding, or combinations of these methods. Finally, dispenser 10 has two lateral projections 17 and 17' useful for the handling with mechanical means in the production line and for connection to electric terminals in order to heat it.

In FIG. 3 another possible dispenser 30 according to the invention is represented partially cut away. In this case the container of mixture 16 is formed by a foil 31 (for instance metallic) similar to foil 12 of FIGS. 1 and 2, whereas the surface portion of the container permeable to cesium vapors is formed by a porous body 32 comprising or formed of a getter material. Body 32 can be maintained in position by any method. For example only, in FIG. 3 a retaining element 33 is shown secured to foil 31 by means of welding spots 34. Body 32 can be maintained in the desired position by means of any other retaining element, fixed to foil 31 in any suitable way. Body 32 may be formed of sintered getter material only. Such a getter body can be obtained for example according to the method described in European Patent EP-B-0 719 609 in the name of SAES Getters S.p.A. Alternatively, body 32 may be formed of getter material deposited according to various methods on a supporting open structure, such as a wire net having meshes of suitable dimensions. Similar open structures are described for example in U.S. Pat. No. 4,146,497 in the name of SAES Getters S.p.A., or may be produced by depositing getter particles on a wire net through the electrophoretic technique, as described for example in U.S. Pat. No. 4,628,198. By this structure, the getter body 32 fulfills the double function of allowing the passage of cesium vapors, yet retaining the particles of mixture 16, and avoiding the pollution of the atmosphere in the process chamber, where the dispenser is used, by gases such as water, carbon oxides, etc., that can be released by the components of the mixture.

Finally, FIGS. 4 and 5 represent a further possible form of dispenser using the mixtures of the invention, that is useful when it is necessary to vaporize small amounts of cesium. This dispenser has the structure described in U.S. Pat. No. 3,598,384. FIG. 4 shows the dispenser in a top plan view, and FIG. 5 is a sectional view along line V—V' of FIG. 4. Dispenser 40 is formed of a container 41 having an extended structure with a trapezoidal section and a longitudinal slit 42 blocked by a wire 43 that allows the vaporization of cesium; but prevents the powdery mixture 44 from escaping. Container 41 is tapered at its ends about two terminals 45, 45' that fulfill the double function of closing the ends and as electric terminals for heating the assembly.

In a second aspect, the invention relates to a process for using the above-described dispensers in the production of screens of the OLED type.

The structure of an OLED (briefly described above) is produced, by means of techniques that are typical in the microelectronic industry, by prearranging the first transparent support and depositing in sequence thereon the various forming layers. The electrodes are generally deposited according to techniques such as screen printing. The layers of organic materials are obtained in general by means of vaporization or the technique known as "spin coating," consisting in the deposition of a drop of liquid material on the support and swift rotation of the latter.

As the used organic materials and especially the second set of electrodes (generally made of metals, such as barium) are extremely sensitive to atmospheric agents and in particular to water vapor, at least the arranging steps of these layers and the subsequent ones must take place in proper chambers, under vacuum or inert atmosphere. The cesium dispensers of the invention are especially suitable for introducing the element into the active structure during these treatments in the chamber.

In particular the process of the invention comprises the steps of:
  introducing a cesium dispenser into a chamber having a controlled atmosphere and being provided with means for heating it;
  arranging in the chamber the production intermediate of the OLED screen as obtained after having formed the organic multilayer;
  causing the vaporization of cesium from the dispenser by heating the latter; and
  carrying out the subsequent production phases of the OLED screen up to its sealing with the second support.

For the objects of the invention, it is not required that these phases be carried out in the above order. In addition, the cesium vaporization operation may be accomplished in different production times of the OLED. Possible changes in the process of the invention will be described below in more detail.

The chamber with controlled atmosphere can be one of those already provided for carrying out the other production process steps of the OLEDs, or can be a chamber dedicated to the cesium vaporization operation. This chamber must be provided with means for heating the dispenser, that can be radiative (infrared lamps) or, in the case of a dispenser with a metallic or graphitic container, of inductive type. The heating can be carried out alternatively by direct passage of current, by prearranging a heatable support for the dispenser or even, in the case of containers made of graphite, boron nitride and metal (for instance of the type previously described with reference to FIGS. 1 and 2), by heating the dispenser through direct passage of current in the container walls. In this latter case, the heating means in the chamber will be simply electric through means with suitable terminals for connection to the container.

In the case where the cesium vaporization chamber is a chamber in which other process operations are also effected, the dispenser will be introduced prior to the vaporization phase and thermally activated at a convenient time. If, on the contrary, the chamber is used exclusively for vaporizing cesium, in the chamber where the dispenser is already present there is introduced a production intermediate of the OLED. Cesium is then vaporized from the dispenser by heating it with the previously mentioned means at a temperature between about 250 and 450° C., according to the specific cesium compound used therein.

The vaporization of cesium can be effected in various intermediate production phases of the OLED. For example, the production of the OLED may comprise the following main operations:
  production of the first set of electrodes on the first transparent support;
  production of the organic multilayer on the first set of electrodes;
  vaporization of cesium on the organic multilayer,
  production of the second set of electrodes on the organic multilayer;
  other possible operations and sealing along the perimeters of the first and second supports.

Alternatively, the cesium vaporization operation can be subsequent to the production of the second set of electrodes.

The invention will be further illustrated in the following examples relating to some cesium compounds of the invention, and in particular the molybdate and tungstate, in addition to a comparison example with the chromate of the prior art.

EXAMPLE 1

A cesium dispenser is produced, wherein as a compound of the element the molybdate, $Cs_2MoO_4$, is used.

The dispenser is of the kind described in the specification with reference to FIGS. 4 and 5. Container, wire and terminals are made in nickel-chromium alloy. The portion filled with the mixture has a section of about 1 mm×1.5 mm and a length of 25 mm. This container is filled with a mixture of one part by weight of cesium molybdate in powderform and five parts by weight of the mentioned St 101® alloy. The powders have a particle size between 10 and 125 $\mu$m. The linear charging of the container is of about 40 mg of mixture per centimeter.

The so produced dispenser is sample 1.

EXAMPLE 2

A cesium dispenser is produced as described in Example 1 by using, however, as a cesium compound the tungstate, $Cs_2WO_4$. This dispenser is sample 2.

(COMPARATIVE) EXAMPLE 3

A cesium dispenser is produced as described in Example 1, for comparison, by using as a cesium compound the chromate, Cs2CrO₄. This dispenser is sample 3.

EXAMPLE 4

This example relates to the cesium vaporization tests from the dispensers produced in the previous Examples 1–3.

Samples 1–3 are assembled within a chamber that is then evacuated, are connected to electric loops and fed by a current generator. The current is gradually increased with a slope of 0.1 A/min. The temperature of the sample is measured by a thermocouple welded on the outer wall of the container, and the current value is registered that produces the start of cesium vaporization, taken by the aid of a triode sensor mounted near the vaporization slit. The thus taken temperature values of vaporization start are given in the following table.

| Cs compound | Temperature of vaporization start (° C.) |
|---|---|
| $Cs_2MoO_4$ (invention) | 295 |
| $Cs_2WO_4$ (invention) | 250 |
| $Cs_2CrO_4$ (comparison) | 625 |

Based on the test results, it stands out that mixtures using the compounds of the invention are able to release cesium vapors in current, and thus temperature, conditions that are lower in comparison to cesium chromate.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A cesium dispenser (10; 30; 40) comprising a container capable of retaining solid particles, but having at least a portion (14; 32; 42) of a surface permeable to cesium vapors and containing a mixture (16; 44) of materials comprising at least one cesium compound and at least one reducing agent, wherein the cesium compound is selected from the group consisting of molybdate, tungstate, niobate, tantalate, silicate, and zirconate.

2. The dispenser according to claim 1, wherein the mixture comprises a single cesium compound and a single reducing agent.

3. The dispenser according to claim 1, wherein the reducing agent is selected from the group consisting of aluminum, silicon, zirconium, titanium, and alloys containing zirconium or titanium.

4. The dispenser according to claim 3, wherein the reducing agent comprises an alloy having a percent composition by weight Zr 84%—Al 16%.

5. The dispenser according to claim 3, wherein the reducing agent comprises an alloy having a percent composition by weight Zr 76.5%—Fe 23.5%.

6. The dispenser according to claim 1, wherein materials forming the mixture are in powder form.

7. The dispenser according to claim 6, wherein the powders comprise particles having a size smaller than 1 mm.

8. The dispenser according to claim 7, wherein the powders comprise particles having a size smaller than 500 μm.

9. The dispenser according to claim 8, wherein the powders comprise particles having a size between 10 and 125 μm.

10. The dispenser according to claim 1, wherein the weight ratio of the materials forming the mixture is from 10:1 to 1:10.

11. The dispenser according to claim 1, wherein the container comprises a material selected from the group consisting of metals, metal alloys, graphite, boron nitride, and ceramics.

12. The dispenser according to claim 11, wherein the material is selected from the group consisting of molybdenum, tantalum, tungsten, steel, and nickelchromium alloys.

13. The cesium dispenser (10) according to claim 1, wherein the container comprises two joined metal foils (11, 12), the first foil (11) having in its central zone (14) a plurality of holes (15) of small size and the second foil (12) having in its corresponding central zone a depression (13), wherein the mixture (16) of at least one cesium compound and at least one reducing agent is contained in the depression, wherein the two foils are joined so as prevent solid particles from escaping, and wherein the dispenser has two lateral extensions (17, 17') for handling with mechanical means and for connection of the dispenser to electric terminals.

14. The cesium dispenser (30) according to claim 1, wherein the container comprises a foil (31) having a depression which contains the mixture (16) of at least one cesium compound and at least one reducing agent, and a porous body (32) comprising a getter material, wherein the porous body (32) is maintained in position on the depression by a retaining element (33) secured on the foil (31) by welding spots (34).

15. The cesium dispenser (40) according to claim 1, wherein the container (41) comprises an extended structure having trapezoidal section and an longitudinal slit (42) blocked by a wire (43) that allows vaporization of cesium but prevents the mixture of materials (44) present in the container from escaping, and wherein the container is tapered at its ends around two terminals (45, 45') that close the ends and form electric contacts for heating the dispenser.

16. A process for production of an OLED'screen comprising a first transparent support, a first set of electrodes, an organic multilayer, a second set of electrodes and a second support, comprising the steps of:

introducing a cesium dispenser according to claim 1 into a chamber having a controlled atmosphere and means for heating the chamber, arranging in the chamber a production intermediate of the OLED screen, the production intermediate being one obtained after having formed the organic multilayer;

causing vaporization of cesium from the dispenser by heating the dispenser; and carrying out subsequent production steps of the OLED screen up to its sealing with the second support.

17. The process according to claim 16, comprising the following series of operations:

producing the first set of electrodes on the first transparent support;

producing the organic multilayer on the first set of electrodes;

vaporizing cesium on the organic multilayer;

producing the second set of electrodes on the organic multi layer; and sealing the first and second supports along their perimeters.

18. The process according to claim 16, comprising the following series of operations:

producing the first set of electrodes on the first transparent support;

producing the organic multilayer on the first set of electrodes;

producing the second set of electrodes on the organic multilayer;

vaporizing cesium on the second set of electrodes; and sealing the first and second supports along their perimeters.

* * * * *